United States Patent
Sanchez et al.

(10) Patent No.: US 8,018,259 B2
(45) Date of Patent: Sep. 13, 2011

(54) PHASE-LOCKED LOOP HAVING A FEEDBACK CLOCK DETECTOR CIRCUIT AND METHOD THEREFOR

(75) Inventors: Hector Sanchez, Cedar Park, TX (US); Gayathri A. Bhagavatheeswaran, Austin, TX (US); Xinghai Tang, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/695,461

(22) Filed: Jan. 28, 2010

(65) Prior Publication Data

US 2011/0181326 A1    Jul. 28, 2011

(51) Int. Cl.
*H03L 7/06* (2006.01)
(52) U.S. Cl. .................................. 327/159; 327/156
(58) Field of Classification Search ............ 327/159, 327/156
See application file for complete search history.

(56) References Cited

U.S. PATENT DOCUMENTS

| | | | | |
|---|---|---|---|---|
| 4,931,748 | A * | 6/1990 | McDermott et al. | 331/1 A |
| 5,561,390 | A * | 10/1996 | Hiiragizawa | 327/147 |
| 5,903,748 | A * | 5/1999 | McCollough et al. | 713/503 |
| 7,288,975 | B2 * | 10/2007 | Ngo et al. | 327/156 |
| 2004/0221208 | A1* | 11/2004 | Floyd et al. | 714/50 |
| 2005/0242852 | A1* | 11/2005 | Parker et al. | 327/156 |
| 2011/0080196 | A1* | 4/2011 | Wang et al. | 327/156 |

* cited by examiner

*Primary Examiner* — Lincoln Donovan
*Assistant Examiner* — Ryan C Jager
(74) *Attorney, Agent, or Firm* — Daniel D. Hill; Ranjeev Singh

(57) ABSTRACT

A method for a phase-locked loop (PLL) in an integrated circuit, wherein the PLL comprises a voltage-controlled oscillator (VCO). The method includes, in a training mode: (1) setting a control voltage of the VCO at a first voltage level; (2) increasing the control voltage of the VCO from the first voltage level to a second voltage level, until a loss of the feedback signal is detected; and (3) storing an indicator value corresponding to the second voltage level of the control voltage of the VCO. The method further includes, in a normal mode: (1) monitoring a voltage level of the control voltage of the VCO by generating a monitored indicator value corresponding to the voltage level of the control voltage of the VCO; and (2) asserting the loss of feedback signal based on a comparison of the monitored indicator value and the indicator value.

13 Claims, 4 Drawing Sheets

PHASE-LOCKED LOOP HAVING A FEEDBACK CLOCK DETECTOR CIRCUIT AND METHOD THEREFOR

BACKGROUND

1. Field

This disclosure relates generally to electronic circuits, and more specifically, to a phase-locked loop (PLL) having a feedback clock detector circuit and method therefor.

2. Related Art

A PLL is used to generate a clock signal from a reference clock and typically includes a phase-frequency detector (PFD), a charge pump, and a voltage controlled oscillator (VCO). A feedback signal is provided from the output of the VCO to the PFD to adjust a frequency of the VCO. The generated clock signal may be at the same frequency as the reference clock signal or at some fraction or multiple frequency.

In some systems, the feedback circuit cannot operate as fast as the VCO output clock. The VCO output clock frequency is the frequency of the VCO or some multiple thereof. When a reference signal is present, but the feedback signal is not, the PFD enables the injection of current in a loop filter of the PLL to increase the frequency of the VCO. If the VCO output clock frequency increases to a point beyond which the feedback circuit can control, an unstable condition may develop, causing the VCO to "runaway", or speed up to the maximum frequency of the VCO. The PLL may remain unlocked and be in an unrecoverable condition because of the inability of the feedback circuit to correct the VCO output clock frequency. A system being clocked by the PLL may then be non-functional.

Therefore, what is needed is a PLL that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
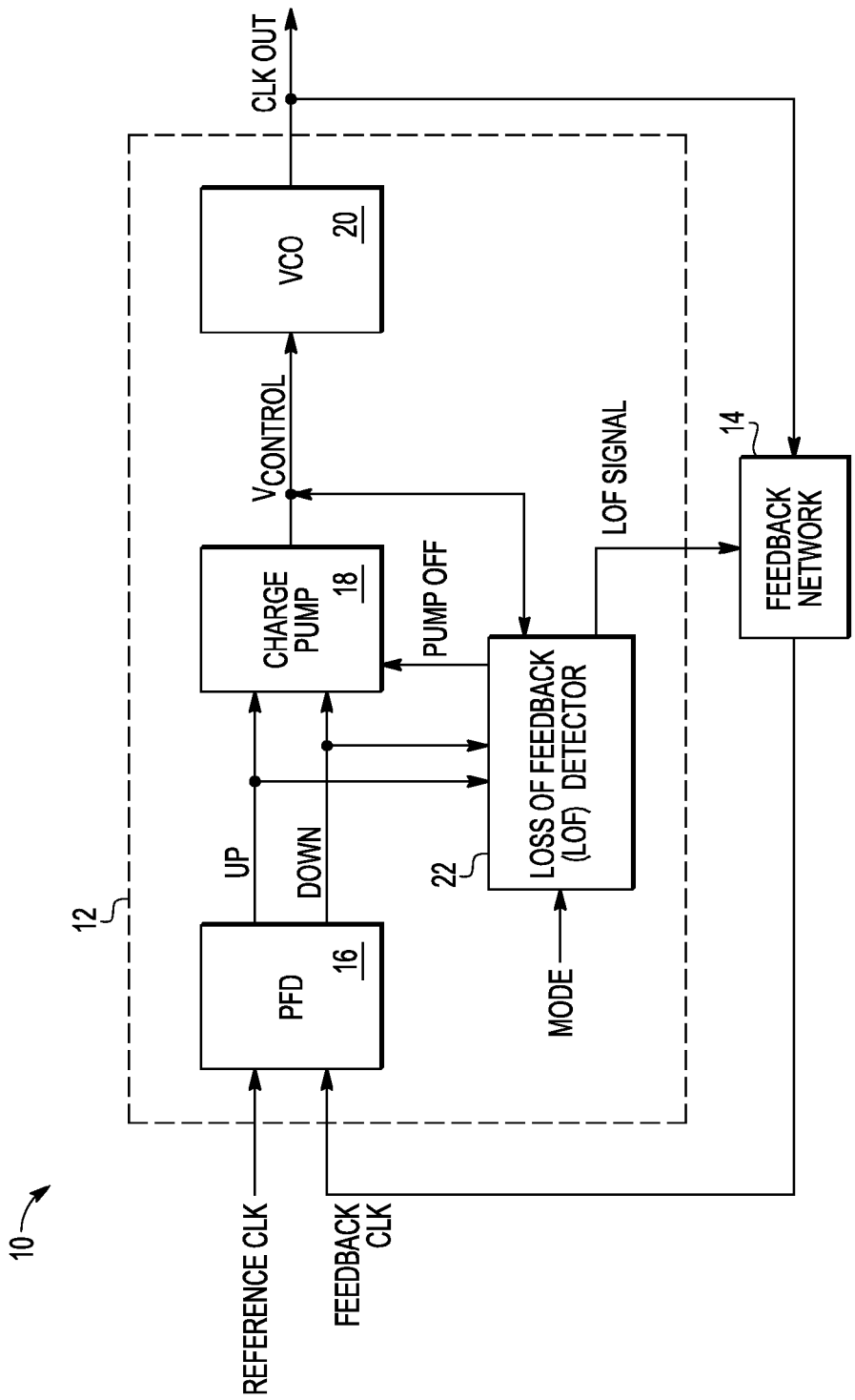
FIG. 1 illustrates, in block diagram form, a clock system in accordance with an embodiment.

Generally, there is provided, a clock system having a PLL. The PLL includes a loss-of-feedback (LOF) signal that is asserted when a feedback signal is not present. The PLL includes a training mode that is used for establishing a maximum voltage that can be applied to a voltage controlled oscillator (VCO) of the PLL without causing the feedback signal to malfunction. During training mode operation, an LOF detector includes a voltage generator that is used to provide a control voltage to the input of the VCO. The control voltage is ramped through a predetermined voltage range and the feedback signal is monitored. When the feedback signal indicates that the feedback path is being overrun by the VCO, then the corresponding control voltage is stored. During normal mode operation of the PLL, the control voltage is provided by a charge pump. The control voltage provided to the VCO is continually compared to the stored control voltage. If the current control voltage matches, or is equal to, the stored control voltage, then the PLL is in danger of losing its feedback signal because the VCO is running too fast. To prevent a system failure, the LOF detector asserts an LOF signal to the feedback path of the PLL. The feedback path then takes an action designed to ensure correct operation of the clock system.

In one aspect, there is provided, a method for a phase-locked loop (PLL) in an integrated circuit, wherein the PLL comprises a voltage-controlled oscillator (VCO), and wherein the PLL is configured to receive a reference signal and a feedback signal, the method comprising: operating the PLL in a training mode, wherein operating the PLL in the training mode comprises: setting a control voltage of the VCO at a first voltage level, increasing the control voltage of the VCO from the first voltage level to a second voltage level, until a loss of the feedback signal is detected, and storing an indicator value corresponding to the second voltage level of the control voltage of the VCO; and after operating the PLL in the training mode, operating the PLL in a normal mode, wherein operating the PLL in the normal mode comprises: monitoring a voltage level of the control voltage of the VCO by generating a monitored indicator value corresponding to the voltage level of the control voltage of the VCO, and asserting the loss of feedback signal based on a comparison of the monitored indicator value and the indicator value. The loss of the feedback signal may be detected using a feedback loss detect circuit. Each of the indicator value and the monitored indicator value may be a digital value generated by converting respective voltage levels from an analog form into a digital form using an analog to digital converter. The loss of feedback signal may be detected using a feedback loss detect circuit and wherein the feedback loss detect circuit may further comprise a logic circuit, a first register, and a second register, and wherein the digital value corresponding to the indicator value may be stored in the first register based on a first enable signal from the logic circuit and wherein the digital value corresponding to the monitored indicator value may be stored in the second register based on a second enable signal from the logic circuit. The feedback loss detect circuit may further comprise a comparator and wherein the step of asserting the loss of feedback signal may further comprise comparing the digital value stored in the first register with the digital value stored in the second register using the comparator. The loss of the feedback signal may be detected using a feedback loss detect circuit and wherein the feedback loss detect circuit may further comprise a voltage generator for generating the control voltage of the VCO and a unity amplifier for amplifying the control voltage of the VCO, and wherein the method may further comprise, during the operating mode, decoupling the voltage generator and the unity amplifier from the analog to digital converter. Generating the monitored indicator value may further comprise adding an offset to the monitored indicator value. The steps of operating the PLL in the training mode and operating the PLL in the normal mode may be performed in-situ and in real-time. The step of operating the PLL in the training mode may be performed each time the integrated circuit is powered on.

In another aspect, there is provided, a method for a phase-locked loop (PLL) in an integrated circuit, wherein the PLL comprises a voltage-controlled oscillator (VCO), and wherein the PLL is configured to receive a reference signal and a feedback signal, the method comprising: operating the PLL in a training mode, wherein operating the PLL in the training mode comprises: setting a control voltage of the VCO at a first voltage level, to determine a second voltage level of the control voltage of the VCO, increasing the control voltage of the VCO from the first voltage level to a second voltage level, until a loss of the feedback signal is detected; and after operating the PLL in the training mode, operating the PLL in a normal mode, wherein operating the PLL in the normal mode comprises: monitoring a voltage level of the control voltage of the VCO, and asserting the loss of feedback signal by comparing the monitored voltage level with the second voltage level. Loss of the feedback signal may be detected using a feedback loss detect circuit. The step of comparing the monitored voltage level with the second voltage level may comprise converting the monitored voltage level into a monitored indicator value and converting the second voltage level into an indicator value and comparing the monitored indicator value with the indicator value. The feedback loss detect circuit may further comprise a logic circuit and a comparator, and wherein the step of comparing the monitored voltage level with the second voltage level may comprise selecting a voltage level as the second voltage level based on a control signal received from the logic circuit. The step of generating the monitored voltage level may comprise adding an offset voltage to the monitored voltage level. The steps of operating the PLL in the training mode and operating the PLL in the normal mode may be performed in-situ and in real-time. The step of operating the PLL in the training mode may be performed each time the integrated circuit is turned on.

In yet another aspect, there is provided, a phase-locked loop (PLL) in an integrated circuit, wherein the PLL comprises a voltage-controlled oscillator (VCO), and wherein the PLL is configured to receive a reference signal and a feedback signal, the PLL comprising: a first control logic portion for setting a control voltage of the VCO at a first voltage level and for increasing the control voltage of the VCO from the first voltage level to a second voltage level, until a loss of the feedback signal is detected; a first register for storing an indicator value corresponding to the second voltage level of the control voltage of the VCO; a second control logic portion for monitoring a voltage level of the control voltage of the VCO and for generating a monitored indicator value corresponding to the voltage level of the control voltage of the VCO; a second register for storing the monitored indicator value; and a third control logic portion for asserting the loss of feedback signal based on a comparison of the monitored indicator value and the indicator value. The PLL may further comprise: an analog to digital converter for converting the second voltage level into the indicator value and for converting the monitored voltage level into the monitored indicator value; and a comparator for comparing the indicator value with the monitored indicator value to generate the loss of feedback signal. The first control logic portion may be configured to operate the PLL in a training mode in response to a first value of a mode control signal and wherein the second control logic portion may be configured to operate the PLL in a normal mode in response to a second value of the mode control signal. The PLL may be configured to operate in the training mode and to operate in the normal mode each time the integrated circuit is powered on.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

FIG. 1 illustrates, in block diagram form, a clock system 10 in accordance with an embodiment. Clock system 10 includes PLL 12 and feedback network 14. Phase-locked loop 12 includes phase-frequency detector (PFD) 16, charge pump 18, voltage controlled oscillator (VCO) 20, and loss of feedback (LOF) detector 22. In one embodiment, PLL 12 is provided on a single integrated circuit and feedback network 14 is provided on a separate integrated circuit. In another embodiment, both PLL 12 and feedback network 14 are provided on the same integrated circuit. Phase-frequency detector 16 has a first input for receiving a reference clock labeled "REF CLK", a second input for receiving a feedback signal labeled "FEEDBACK CLK", a first output signal for providing a pump control signal labeled "UP", and a second output signal for providing a pump control signal labeled "DOWN". Charge pump 18 has first and second inputs for receiving pump control signals and an output for providing a voltage labeled "$V_{CONTROL}$". Voltage controlled oscillator 20 has an input coupled to the output of charge pump 18, and an output for providing a clock signal labeled "CLK OUT". Feedback network 14 has an input coupled to the output of VCO 20, an input coupled to receive a loss of feedback signal labeled "LOF SIGNAL", and an output coupled to the second input of PFD 16 for providing feedback clock FEEDBACK CLK. LOF detector 22 has a first input coupled to receive pump control signal UP, a second input coupled to receive pump control signal DOWN, an input/output coupled to the output of charge pump 18, an output for providing signal PUMP OFF, and an output coupled to provide LOF SIGNAL to feedback network 14.

PLL 12 has a normal operating mode and a training operating mode that are controlled in response to mode control signal MODE. Although PLL 12 is described as having two operating modes in the illustrated embodiment, other embodiments may have more than two operating modes or only one operating mode. During a normal mode of operation, control voltage $V_{CONTROL}$ is provided to VCO 20 by charge pump 18. During a training mode of operation, LOF detector 22 provides control voltage $V_{CONTROL}$ to the input of VCO 20. Signal PUMP OFF is asserted to disable the output of charge pump 18. Training mode may be entered each time the PLL is powered up, or in response to the mode signal MODE. The training mode is used for establishing a maximum voltage that can be applied to a voltage controlled oscillator (VCO) of the PLL without causing the feedback signal to malfunction. The feedback signal may malfunction, for example, if the feedback logic has a lower maximum operating frequency than the VCO and the VCO frequency is allowed to exceed the maximum frequency of the feedback logic. Control voltage $V_{CONTROL}$ is ramped up from a first voltage level to a second voltage level. While LOF detector 22 is ramping $V_{CONTROL}$ to the input of VCO 20, LOF detector 22 monitors the UP and DOWN pump signals, and if the DOWN pump signal has not been detected as being asserted by PFD 18 for a predetermined time period, then it is determined that feedback signal FEEDBACK CLK has become inoperative and that VCO 20 has therefore become uncontrollable. The control voltage VCONTROL at which the feedback clock FEEDBACK CLK became inoperative is stored in a storage element of LOF detector 22.

Note that the illustrated embodiment uses a training mode to determine the maximum control voltage $V_{CONTROL}$ as which VCO 20 can be operated. However, in other embodiments, the LOF detector 22 may be used without first determining the maximum control voltage $V_{CONTROL}$. That is, LOF detector 22 may operate in situ and in real time by simply monitoring pump signals UP and DOWN and determining that feedback clock FEEDBACK CLK has been lost when pump signal DOWN has not been detected for a predetermined amount of time. When the determination has been made, corrective action is taken.

During the normal operating mode, reference clock REF CLK is provided as an input to PFD 16. PFD 16 compares reference clock REF CLK to feedback clock FEEDBACK CLK. If the phase of REF CLK leads the phase of FEEDBACK CLK, then PFD 16 asserts pump signal UP to increase the voltage of $V_{CONTROL}$ to increase the output frequency of VCO 20. If the phase of REF CLK lags the phase of FEEDBACK CLK, then PFD 16 asserts pump signal DOWN to decrease the output frequency of VCO 20. LOF detector 22 monitors the operation of PLL 12 during the normal operating mode operation. If operating conditions cause the voltage level of $V_{CONTROL}$ to approach or equal the voltage of the stored voltage that caused the feedback clock to become inoperative, then loss of feedback signal LOF SIGNAL is asserted to feedback network 14 to correct the operation of VCO 20. The PLL operation may be corrected in a number of ways. For example, control voltage $V_{CONTROL}$ can be limited so that it does not exceed a maximum voltage. Also, PLL operation may be corrected by enabling a divider or dividers (not shown) in the output of PLL 12 to divide the VCO output frequency to a value that will cause the feedback network to operate correctly. The divider may be disengaged after proper operation is achieved. In addition, upon detecting that the VCO frequency is near a maximum frequency, LOF detector 22 may cause PFD 16 to command a DOWN signal so that the VCO slows down and resumes proper locking. In other embodiments, other corrective actions can be taken. Also, in other embodiments, the LOF SIGNAL may be provided to a different circuit element to correct operation of PLL 12.

Figure 2:
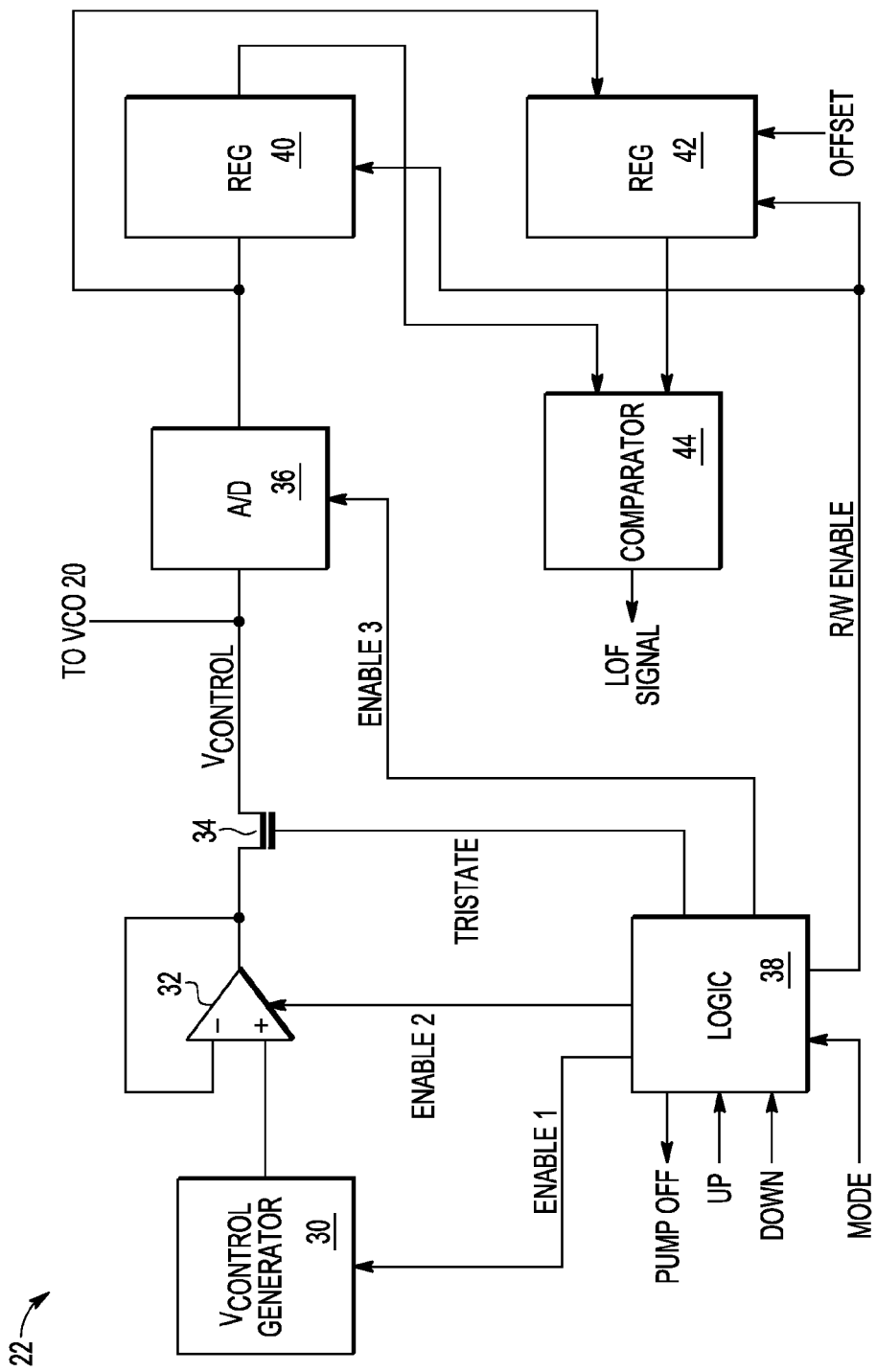
FIG. 2 illustrates, in partial block diagram form and partial schematic diagram form, the loss of feedback detector of the clock system of FIG. 1 in accordance with an embodiment.

FIG. 2 illustrates, in partial block diagram form and partial schematic diagram form, LOF detector 22 of clock system 10 of FIG. 1 in accordance with an embodiment. Loss of feedback detector 22 includes $V_{CONTROL}$ generator 30, unity gain amplifier 32, transistor 34, analog-to-digital (A/D) converter 36, logic 38, registers 40 and 42, and comparator 44. $V_{CONTROL}$ generator 30 has an input terminal for receiving an enable signal labeled "ENABLE 1", and an output. Amplifier 32 has a positive input coupled to the output of $V_{CONTROL}$ generator 30, a negative input, and an output coupled to the negative input. Transistor 34 has a first current electrode coupled to the output of amplifier 32, a control electrode, and a second current electrode for providing control voltage $V_{CONTROL}$. Analog-to-digital converter 36 has an input coupled to the second current electrode of transistor 34, and output, and a control input labeled "ENABLE 3". Register 40 has an input coupled to the output of A/D converter 36, a control input, and an output. Register 42 has an input coupled to the output of A/D converter 36, a control input, an input for receiving an offset voltage labeled "OFFSET", and an output. Comparator 44 has a first input coupled to the output of register 40, a second input coupled to the output of register 42, and an output for providing the LOF SIGNAL. Logic 38 has an input for receiving mode signal MODE, an input for receiving the UP signal, an input for receiving the DOWN signal, an output for providing enable signal ENABLE 1 to the input of $V_{CONTROL}$ generator 30, an output for providing enable signal ENABLE 2 to amplifier 32, an output for providing tristate signal TRISTATE to the control electrode of transistor 34, an output for providing enable signal ENABLE 3 to A/D converter 36, an output for providing read/write control signal R/W ENABLE to inputs of registers 40 and 42.

LOF detector 22 determines that feedback clock FEEDBACK CLOCK has been lost, and then provides output signal LOF SIGNAL to indicate the loss of the feedback clock so that an appropriate action can be taken. As discussed above, feedback clock FEEDBACK CLOCK may be lost because the VCO operating frequency has exceeded a maximum operating frequency of the feedback network 14. To begin operation in accordance with an embodiment, the MODE signal is asserted to place PLL 12 in a training mode. Logic 38 controls the operation of LOF detector 22 by asserting control and enable signals to the various components of LOF detector 22 as illustrated in FIG. 2. Also, signal PUMP OFF is provided to the disable charge pump 18. Logic 38 asserts enable signal ENABLE 1 to cause $V_{CONTROL}$ generator to provide an increasing voltage within a range of voltages from a first voltage level to a second voltage level. For example, the range may be between zero volts and the power supply voltage. Amplifier 32 is enabled by an asserted enable signal ENABLE 2 and pass transistor 34 is enabled by asserting tristate signal TRISTATE to provide $V_{CONTROL}$ to the input of VCO 20. Note that control voltage $V_{CONTROL}$ is provided to the input of VCO 20 by LOF detector 22 during training mode and by charge pump 18 during a normal operating mode. During the training operating mode, VCO 20 provides output clock CLK OUT having an increasing frequency corresponding to the ramping up $V_{CONTROL}$ voltage. Also, during the training mode, PFD 16 continues to provide pump signals UP and DOWN, but because the $V_{CONTROL}$ is not being provided by charge pump 18, the UP and DOWN signals have no effect on the operation of VCO 20. However, logic 38 monitors the operation of pump signals UP and DOWN as PFD 16 attempts to control the operating frequency. When logic 38 detects the absence of a DOWN pump control signal, it is determined that feedback clock FEEDBACK CLOCK is no longer being generated and VCO 20 is in an uncontrolled condition. Logic 38 causes the control voltage that caused the loss of the feedback signal to be stored in registers 40 and 42 by asserting enable signals ENABLE 3 and R/W ENABLE. The voltage level of control voltage $V_{CONTROL}$ is converted to an indicator value. In one embodiment, the indicator value is a digital value corresponding to the control voltage. The digital value is determined by converting the voltage level from an analog form to a digital form using A/D converter 36. The digital value is then stored in registers 40 and 42 in response to the read/write signal R/W ENABLE being asserted to place register 40 in a write mode of operation. An offset voltage OFFSET is added to the voltage level stored in register 42. The value of offset voltage OFFSET is determined to provide a margin so that corrective action can be taken before voltage level that causes uncontrolled VCO operation is reached. After the digital value is stored, training mode operation is terminated.

During a normal operating mode, signals ENABLE 1, ENABLE 2, and TRISTATE are negated to disable $V_{CONTROL}$ generator 30, amplifier 32, and transistor 34. Charge pump 18 (FIG. 1) is used to provide control voltage $V_{CONTROL}$ in response to the UP and DOWN pump signals from PFD 16. Control voltage $V_{CONTROL}$ is sampled and converted to a digital value by A/D converter 36 in a predetermined interval. The digital indicator value is provided to register 40. The digital indicator value plus offset, stored in register 42, is compared to each digital value passed through register 40 by comparator 44. If the values match, then the control voltage $V_{CONTROL}$ is approaching the predetermined value at which VCO 20 becomes uncontrollable. Comparator 44 asserts signal LOF SIGNAL so that an appropriate action can be taken. For example, the LOF SIGNAL can be used to limit the VCO speed to match the speed of the feedback network by forcing the input voltage of the VCO to a voltage low enough to prevent failure. Also, if it is determined that the VCO is at or near its maximum frequency and the feedback clock is not present, then a divider (not shown) at the output of the VCO can divide down the output frequency to cause proper operation to resume. The divider can be later disengaged to allow the PLL to re-establish lock of PLL 12 to the intended operating condition. In addition, in another embodiment, when the VCO frequency is at or near the maximum frequency and the feedback clock is not present, then the output of PFD 16 is adjusted to lower voltage $V_{CONTROL}$ so that the VCO slows down. When a safe voltage is reached, then the PLL can be allowed to re-establish lock. In other embodiments, other corrective actions may be taken.

Figure 3:
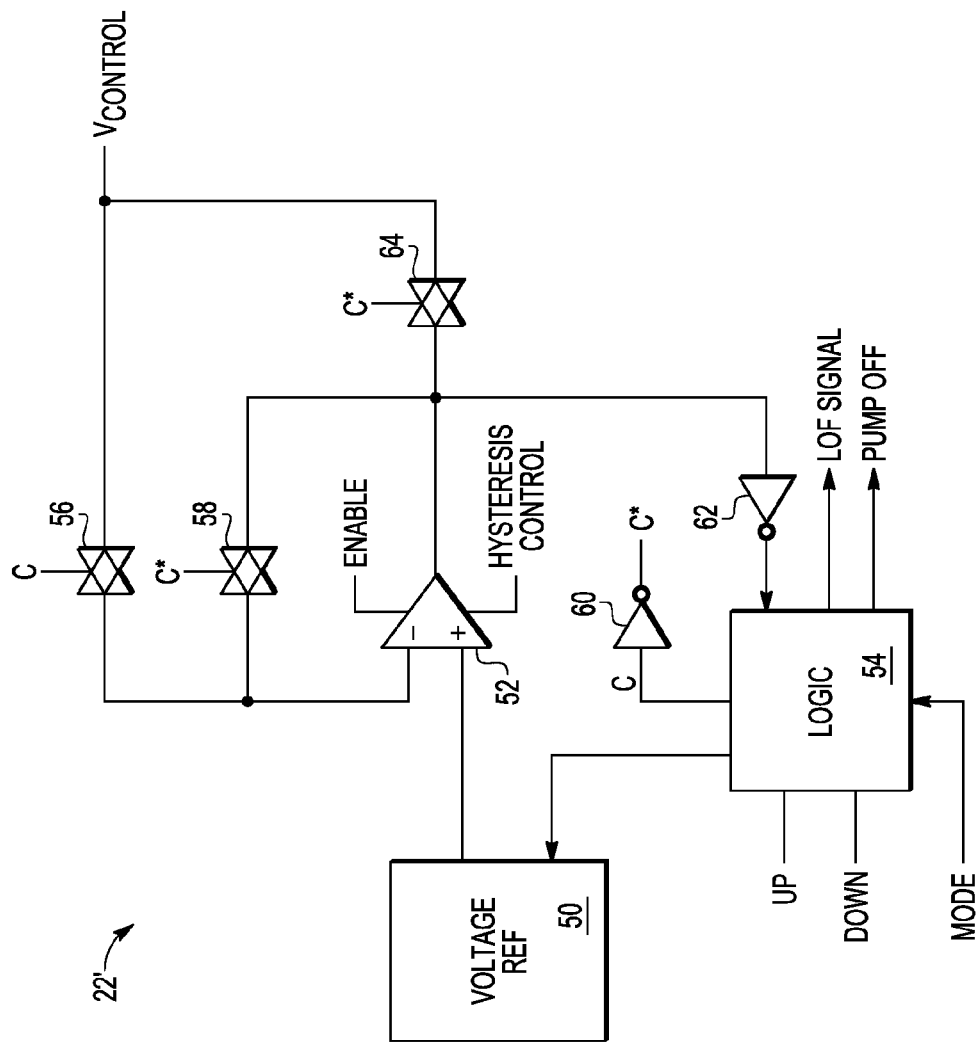
FIG. 3 illustrates, in partial block diagram form and partial logic diagram form, the loss of feedback detector of the clock system of FIG. 1 in accordance with another embodiment.

FIG. 3 illustrates, in partial block diagram form and partial logic diagram form, a loss of feedback detector 22' of the clock system of FIG. 1 in accordance with another embodiment. LOF detector 22' differs from LOF detector 22 in that LOF detector 22' operates in the analog domain instead of the digital domain. LOF detector 22' includes voltage reference 50, amplifier 52, logic 54, transmission gates 56, 58, and 64, and inverters 60 and 62. Voltage reference 50 has an output and an input. Amplifier 52 has a negative input, a positive input coupled to the output of voltage reference 50, an input for receiving enable signal ENABLE, an input for receiving a hysteresis control signal labeled "HYSTERESIS CONTROL", and an output. Transmission gate 56 has a first terminal coupled to the negative input of amplifier 52, a second terminal for providing $V_{CONTROL}$, and a control terminal for receiving control signal C. Transmission gate 58 has a first terminal coupled to the negative input of amplifier 52, a second terminal coupled to the output of amplifier 52, and a control terminal for receiving control signal C*. Note that an asterisk (*) after a signal name indicates that the signal is a logical complement of a signal having the same name but lacking the asterisk (*). Transmission gate 64 has a first terminal coupled to the second terminal of transmission gate 58, a second terminal coupled to the second terminal of transmission gate 56, and a control terminal for receiving signal C*. Logic 54 has an input coupled to receive pump control signal UP, an input coupled to receive pump control signal DOWN, an output coupled to an input of inverter 60, an input coupled to an output of inverter 62, an output for providing signal PUMP OFF, and an output for providing LOF signal LOF SIGNAL. Inverter 60 has an input for receiving control signal C from logic 60, and an output for providing control signal C*. Control signals C and C* are used to control the operation of transmission gates 56, 58, 64. Inverter 62 has an input coupled to the output of amplifier 52, and an output coupled to logic 54.

As discussed above regarding LOF detector 22 illustrated in FIG. 2, the loss of feedback detector 22' determines that the VCO control voltage $V_{CONTROL}$ has caused feedback clock FEEDBACK CLOCK to be lost, and then provides output signal LOF SIGNAL to indicate the loss of the feedback clock so that an appropriate action can be taken, as discussed above. During a training operating mode, logic 54 causes voltage reference 50 to provide an increasing voltage to the positive input of amplifier 52. In one embodiment, the voltage may ramp within a range of zero volts to the power supply voltage. Also, in one embodiment, voltage reference 50 may include a resistor ladder, or divider, with a number of taps to provide a voltage. When in the training mode, transmission gates 58 and 64 are closed and transmission gate 56 is open so that the voltage $V_{CONTROL}$ is provided to the input of VCO 20. Signal PUMP OFF is asserted to disable the output of charge pump 18. As the voltage $V_{CONTROL}$ is ramped up, logic 54 monitors the UP and DOWN pump control signals, and when the DOWN signal has not been asserted for a predetermined amount of time, then the feedback signal FEEDBACK CLK (FIG. 1) has disappeared as discussed above. The voltage reference tap that caused the loss of the feedback signal is held by logic 54. Also, an offset may be added to the selected voltage reference tap, or a lower voltage tap may be selected to add a level of protection, or cushion, to the voltage that caused the loss of feedback clock FEEDBACK CLOCK.

During normal operation, transmission gate 56 is closed and transmission gates 58 and 64 are open. If the voltage level of control voltage $V_{CONTROL}$ is reached that causes loss of the feedback clock FEEDBACK CLK, then the voltage reference tap that was determined during the training mode provides a voltage to the negative input terminal of amplifier 52. At the same time, amplifier 52 receives control voltage $V_{CONTROL}$ at the positive input. Amplifier 52 compares the voltage from the selected tap of voltage reference 50 to control voltage $V_{CONTROL}$. If control voltage $V_{CONTROL}$ at the negative input is higher than the selected reference tap voltage, then a logic high signal is asserted to indicate to logic 54 that feedback clock FEEDBACK CLK has been lost and VCO 20 is uncontrollable. Signal LOF SIGNAL is asserted and corrective action is taken as discussed above. In another embodiment, an offset voltage may be added to VCONTROL so that during normal operation the point of failure is approached but not actually reached.

When the positive and negative input signals of amplifier 52 become relatively close to each other, a jitter problem may develop. To prevent the jitter, hysteresis control signal HYSTERESIS CONTROL is asserted to add hysteresis to amplifier 52.

Figure 4:
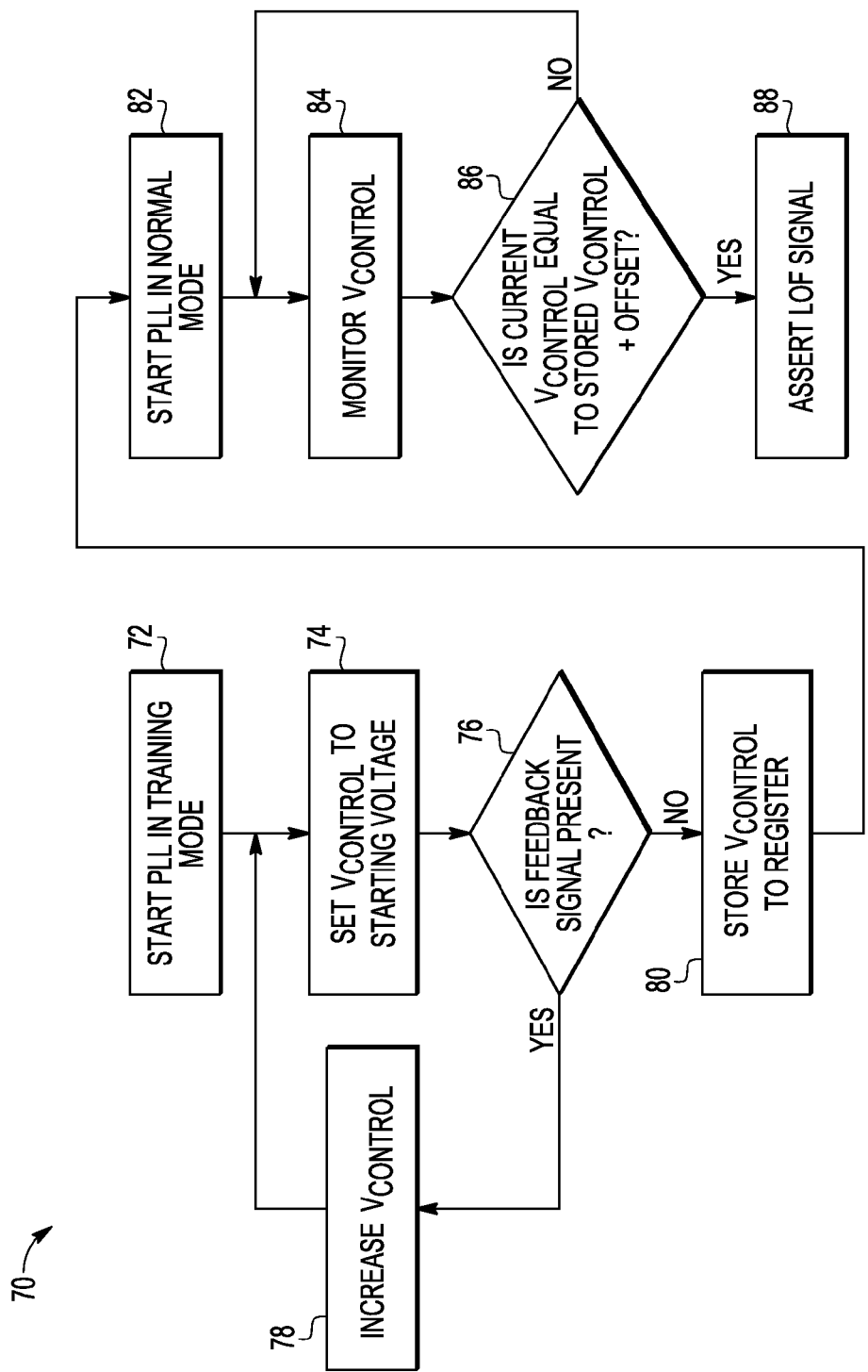
FIG. 4 illustrates a method for detecting a feedback signal in accordance with an embodiment.

FIG. 4 illustrates a method 70 for detecting a feedback signal in accordance with an embodiment. At step 72, the PLL, such as PLL 12 in FIG. 1, is started in training mode using LOF detector 22 to provide the VCO control voltage $V_{CONTROL}$. At step 74, control voltage $V_{CONTROL}$ is set to a starting voltage level. In one embodiment, the starting voltage level may be zero volts. At decision step 76, it is determined if the feedback signal FEEDBACK CLK is present. If FEEDBACK CLK is detected, then the YES path is taken from step 76 to step 78. At step 78, control voltage $V_{CONTROL}$ is increased and the method returns to step 74. Steps 74 and 76 are repeated for increasing values of voltage $V_{CONTROL}$ until the feedback signal FEEDBACK CLK disappears. When it is determined that FEEDBACK CLK has disappeared, the NO path is taken to step 80. At step 80, control voltage $V_{CONTROL}$ that caused the loss of feedback clock FEEDBACK CLK is stored in a storage element. At step 82, the PLL is started in a normal operating mode. At step 84, control voltage $V_{CONTROL}$ is monitored. At decision step 86, the current value of control voltage $V_{CONTROL}$ is compared to the stored value of control voltage $V_{CONTROL}$ and the NO path is taken as long as the current value is not equal to the stored voltage plus an offset. The offset is added to provide a maximum voltage at which the PLL will still operate. At step 86, if the current value of voltage $V_{CONTROL}$ is equal to the stored value of $V_{CONTROL}$, then the VCO has become uncontrollable and the YES path is taken to step 88. At step 88, the LOF SIGNAL is asserted and an appropriate action is taken to correct the uncontrolled PLL operation.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

The description of the system has been simplified for purposes of discussion, and it is just one of many different types of appropriate systems that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the systems depicted herein are merely exemplary, and that in fact many other systems can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of systems or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for a phase-locked loop (PLL) in an integrated circuit, wherein the PLL comprises a voltage-controlled oscillator (VCO), and wherein the PLL is configured to receive a reference signal and a feedback signal, the method comprising:
   operating the PLL in a training mode, wherein operating the PLL in the training mode comprises:
      setting a control voltage of the VCO at a first voltage level,
      increasing the control voltage of the VCO from the first voltage level to a second voltage level, until a loss of the feedback signal is detected, and
      storing an indicator value corresponding to the second voltage level of the control voltage of the VCO; and
   after operating the PLL in the training mode, operating the PLL in a normal mode, wherein operating the PLL in the normal mode comprises:
      monitoring a voltage level of the control voltage of the VCO by generating a monitored indicator value corresponding to the voltage level of the control voltage of the VCO, and
      asserting the loss of feedback signal based on a comparison of the monitored indicator value and the indicator value.

2. The method of claim 1, wherein the loss of the feedback signal is detected using a feedback loss detect circuit.

3. The method of claim 1, wherein each of the indicator value and the monitored indicator value is a digital value generated by converting respective voltage levels from an analog form into a digital form using an analog to digital converter.

4. The method of claim 1, wherein the loss of feedback signal is detected using a feedback loss detect circuit and wherein the feedback loss detect circuit further comprises a logic circuit, a first register, and a second register, and wherein the digital value corresponding to the indicator value is stored in the first register based on a first enable signal from the logic circuit and wherein the digital value corresponding to the monitored indicator value is stored in the second register based on a second enable signal from the logic circuit.

5. The method of claim 4, wherein the feedback loss detect circuit further comprises a comparator and wherein the step of asserting the loss of feedback signal further comprises comparing the digital value stored in the first register with the digital value stored in the second register using the comparator.

6. The method of claim 3, wherein the loss of the feedback signal is detected using a feedback loss detect circuit and wherein the feedback loss detect circuit further comprises a voltage generator for generating the control voltage of the VCO and a unity amplifier for amplifying the control voltage of the VCO, and wherein the method further comprises, during the normal operating mode, decoupling the voltage generator and the unity amplifier from the analog to digital converter.

7. The method of claim 1, wherein generating the monitored indicator value further comprises adding an offset to the monitored indicator value.

8. The method of claim 1, wherein the steps of operating the PLL in the training mode and operating the PLL in the normal mode are performed in-situ and in real-time.

9. The method of claim 1, wherein the step of operating the PLL in the training mode is performed each time the integrated circuit is powered on.

10. A phase-locked loop (PLL) in an integrated circuit, wherein the PLL comprises a voltage-controlled oscillator (VCO), and wherein the PLL is configured to receive a reference signal and a feedback signal, the PLL comprising:

a first control logic portion for setting a control voltage of the VCO at a first voltage level and for increasing the control voltage of the VCO from the first voltage level to a second voltage level, until a loss of the feedback signal is detected;

a first register for storing an indicator value corresponding to the second voltage level of the control voltage of the VCO;

a second control logic portion for monitoring a voltage level of the control voltage of the VCO and for generating a monitored indicator value corresponding to the voltage level of the control voltage of the VCO;

a second register for storing the monitored indicator value; and a third control logic portion for asserting the loss of feedback signal based on a comparison of the monitored indicator value and the indicator value.

11. The PLL of claim 10 further comprising:

an analog to digital converter for converting the second voltage level into the indicator value and for converting the monitored voltage level into the monitored indicator value; and a comparator for comparing the indicator value with the monitored indicator value to generate the loss of feedback signal.

12. The PLL of claim 10, wherein the first control logic portion is configured to operate the PLL in a training mode in response to a first value of a mode control signal and wherein the second control logic portion is configured to operate the PLL in a normal mode in response to a second value of the mode control signal.

13. The PLL of claim 12, wherein the PLL is configured to operate in the training mode and to operate in the normal mode each time the integrated circuit is powered on.

* * * * *